US010883857B2

(12) United States Patent
Bilbao De Mendizabal

(10) Patent No.: US 10,883,857 B2
(45) Date of Patent: Jan. 5, 2021

(54) INTEGRATED MAGNETIC STRUCTURE

(71) Applicant: Melexis Technologies NV, Tessenderlo (BE)

(72) Inventor: Javier Bilbao De Mendizabal, Zurich (CH)

(73) Assignee: Melexis Technologies NV, Tessenderlo (BE)

( * ) Notice: Subject to any disclaimer, the term of this patent is extended or adjusted under 35 U.S.C. 154(b) by 0 days.

(21) Appl. No.: 16/157,306

(22) Filed: Oct. 11, 2018

(65) Prior Publication Data

US 2019/0113366 A1 Apr. 18, 2019

(30) Foreign Application Priority Data

Oct. 12, 2017 (EP) ..................... 17196194

(51) Int. Cl.
*G01D 5/16* (2006.01)
*G01R 33/00* (2006.01)

(52) U.S. Cl.
CPC ........... *G01D 5/16* (2013.01); *G01R 33/0011* (2013.01)

(58) Field of Classification Search
CPC ............... G01R 33/0011; G01D 5/16
See application file for complete search history.

(56) References Cited

U.S. PATENT DOCUMENTS

| 8,957,679 B2 | 2/2015 | Loreit et al. |
| 2002/0021124 A1 | 2/2002 | Schott et al. |
| 2004/0137275 A1 | 7/2004 | Jander et al. |
| 2011/0309829 A1* | 12/2011 | Loreit ............ G01D 1/00 324/252 |
| 2014/0021571 A1 | 1/2014 | Lei et al. |
| 2015/0028863 A1* | 1/2015 | Zeyen ............ G01R 33/0052 324/244 |

FOREIGN PATENT DOCUMENTS

DE 19532674 C1 11/1996

OTHER PUBLICATIONS

European Search Report from EP Application No. 17196194, dated Apr. 24, 2018.

* cited by examiner

*Primary Examiner* — Jermele M Hollington
*Assistant Examiner* — Suresh K Rajaputra
(74) *Attorney, Agent, or Firm* — Workman Nydegger

(57) ABSTRACT

A magnetic field sensor is described comprising at least three magnetic flux concentrator sections integrated on a planar substrate, each section being adjacent to at least one of the other sections and being separated by gaps. The sensor comprises at least a first sensing element positioned for sensing flux density in or near the gap between a first section and a second section and at least a second sensing element positioned for sensing flux density in or near the gap between the first section and at least a further section. The magnetic field sensor further comprises further sensing elements arranged to measure changes of the magnetic field in the direction perpendicular to the substrate.

20 Claims, 7 Drawing Sheets

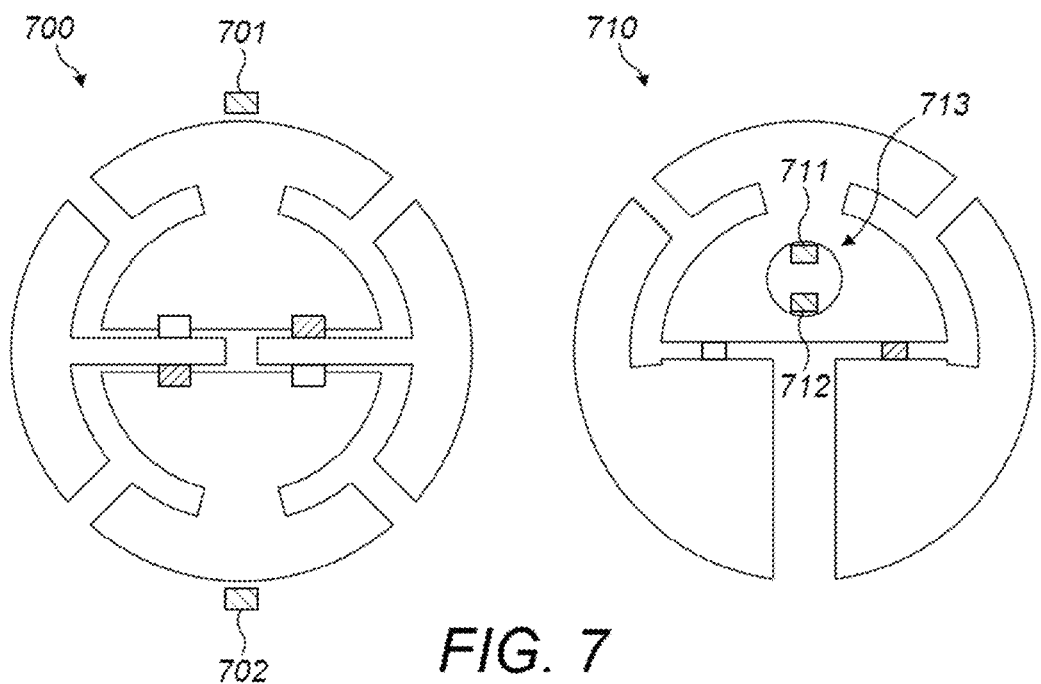
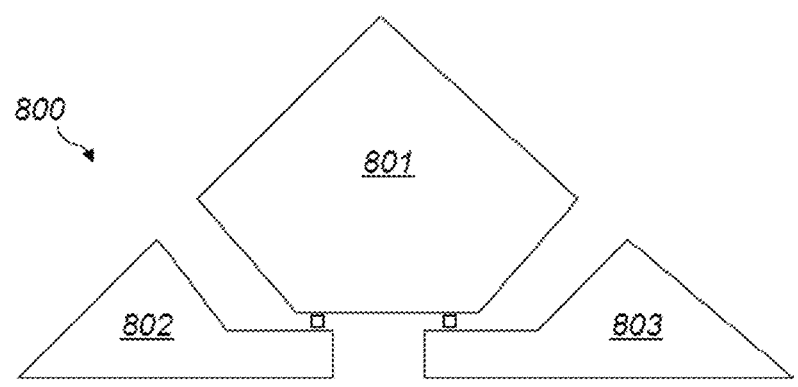
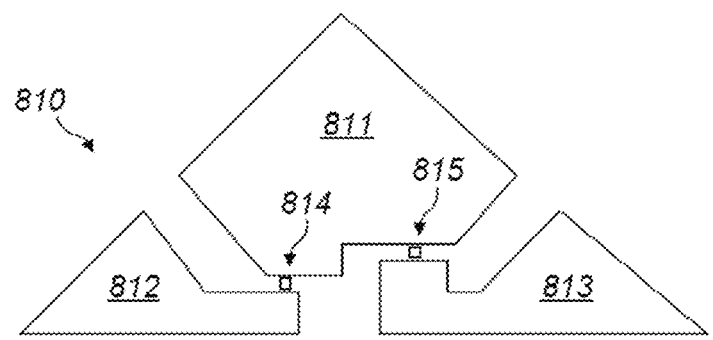
FIG. 8

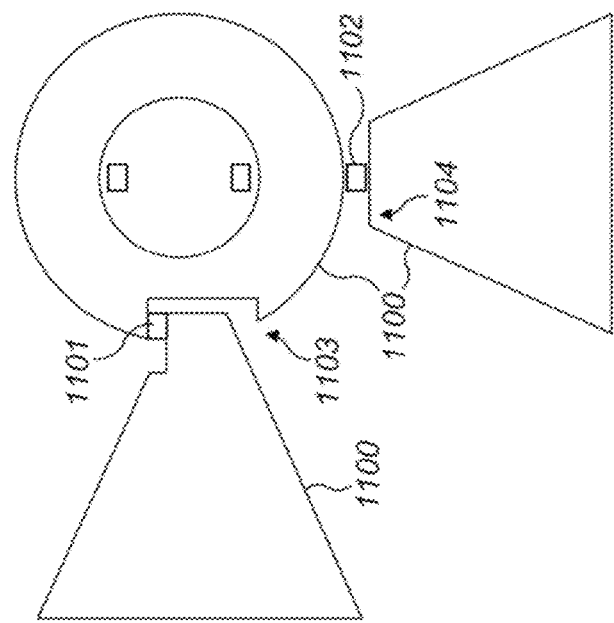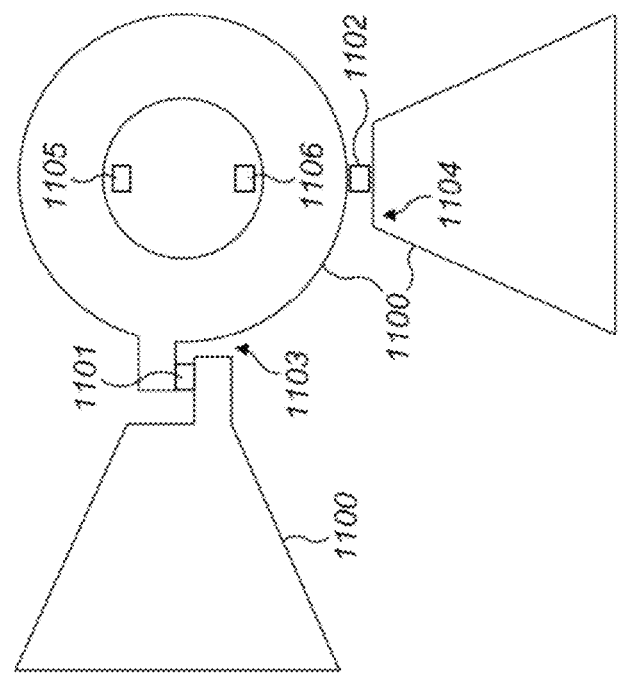
FIG. 11

INTEGRATED MAGNETIC STRUCTURE

FIELD OF THE INVENTION

The invention relates to the field of magnetic sensors. More specifically it relates to magnetic sensors using integrated magnetic concentrators (IMC)

BACKGROUND OF THE INVENTION

In different fields of technology, detection of the magnetic field and its orientation is advantageous, for example in electronic devices and integrated devices, sensors, compasses, in industrial applications or in automobile applications (e.g. in gear tooth sensors, steering angle or transmission position sensors, etc.). Magnetic sensors should be highly integratable, compact, inexpensive and should have high sensitivity. Hall sensors have been traditionally used, but their magnetic field sensitivity is now often not high enough anymore to satisfy the continuously increasing requirements for speed, resolution and sensitivity.

Soft magnetic materials can be used as magnetic flux concentrators. Flux concentration allows to redirect field lines and to concentrate the field lines in predetermined regions, in which magnetic sensing elements can be placed. Increasing the amount of field lines through sensing elements typically results in a relatively high detectable signal, even if the sensitive elements cover only a relatively small region and/or if the signal is weak. In general, magnetic concentrators thus can be used to increase sensitivity of magnetic sensors.

The sensitivity can be further increased by using specially designed sensors, such as sensors based on metamaterials like giant magnetoresistance (GMR) ribbons, tunnel magnetoresistance (TMR) or anisotropic magnetoresistance (AMR) elements, which present higher magnetic field sensitivity than Hall sensors.

U.S. Pat. No. 8,957,679 discloses an assembly for measuring one or more components of a magnetic field, exhibiting high sensitivity. The assembly includes a flux concentrator, consisting of a soft-magnetic surface area, and uses layer resistors, showing "resistance variation which is generated by the gigantic magnetoresistive (GMR) effect", in the role of magnetic-sensitive elements. In order to obtain the field in two orthogonal directions, two concentrators disposed in a mirror-symmetrical configuration are typically used. However, the need of two concentrators also increases the size of the assembly, making it less ideal for example for integrated devices for use in automobile and gear tooth sensor, for portable and wearable devices, etc.

A magnetic flux concentrator locally reshapes the field in its surroundings and therefore may also allow sensing of a magnetic field in a direction different from the sensitivity direction of the magnetic sensor. In order to measure for example the field in two non-parallel directions in a plane with two sensors having substantially the same sensitivity direction, the two sensors can be each provided with an independent IMC structure locally disturbing the magnetic field and therefore allowing the measurement of field components in two non-parallel directions. When using for example GMR elements pinned on the substrate and sensitive to the same direction of the field, the orientation of the elements in the sensors must be carefully controlled, in order to avoid wrong readings. Additionally, problems regarding cross-talk between the two sensors also may arise.

SUMMARY OF THE INVENTION

It is an object of embodiments of the present invention to provide a concentrator and a compact magnetic sensor which can measure magnetic field flux density in more than one direction in a plane.

The present invention relates to a magnetic field sensor comprising at least three magnetic flux concentrator sections integrated on a substrate defining a plane, each of the at least three sections being adjacent to at least one of the other sections and being separated by gaps, the sensor comprising at least a first magnetic sensing element positioned for sensing flux density in or near the gap between a first section and a second section, and at least a second magnetic sensing element positioned for sensing flux density in or near the gap between the first section and a third section. For example, the at least first and second sensing elements may be positioned in the gap, or near the gap. Where reference is made to a sensing element being positioned near the gap, reference may be made to a position at a distance of the center of a gap not further than a distance corresponding with the gap length plus the magnetic flux concentrator thickness.

The magnetic field sensor further comprises further sensing elements arranged to measure changes of the magnetic field in the direction perpendicular to the substrate.

It is an advantage of embodiments of the present invention that the deviation of the magnetic field lines of a Bz field due to the asymmetric presence of an IMC structure can be measured.

It is an advantage of embodiments of the present invention that measurement of two signals at the same location can be obtained, thus reducing the offset of the sensing element and the magnet.

It is an advantage of embodiments of the present invention that the magnetic fields in the plane are always redirected by the IMC structures before being sensed by the sensors. In other words, the sensor element(s) are exposed only to magnetic on plane fields redirected by the IMC. The IMC thus advantageously acts as a shield for on plane fields, with the advantage of having a consistent magnetic gain over the 360 degrees.

The IMC structure can for example be used with external uniform fields, such as for example one created by a dipolar magnet.

The shape of the sections and/or the shape and width of the gaps there between may be adapted for directing the magnetic field lines of an external magnetic field inside the concentrator sections such that the magnetic field at the sensing elements is representative of the orientation and magnitude of the external magnetic field.

It is an advantage of embodiments of the present invention that the sensor can measure the magnetic field and its direction through and inside a substrate in orthogonal directions in the plane of the substrate, using a single sensor, hence obtaining a compact and highly integratable sensor. It is a further advantage that the shape of the sections and gaps there between can be adapted so that the amount of field lines in each concentrator section is function of the direction of an incident magnetic field with respect to an arbitrary axis of the sensor.

The sensing elements may be sensitive to magnetic fields in a same direction in the plane of the substrate.

The first, second and third section may be in a non-linear arrangement. The first, second and third section may be in a triangular arrangement. In other words, the first, second and third section is not aligned or not positioned on a single line.

The first section may comprise a magnetic material with higher magnetic permeability than that of the substrate. The second section may be adjacent to the first section and may comprise magnetic material with higher magnetic permeability than that of the substrate, the second section further being separated from the first section by a first gap comprising at least a magnetic sensing element. The third section, e.g. the at least a further section, may be adjacent to the first section separated from it by a second gap, and may comprise at least a magnetic sensing element. The third section may comprise magnetic material with higher magnetic permeability than that of the substrate.

A first gap may comprise at least one border with a section, the second gap comprises at least one border with a different section, wherein the at least two borders are parallel with each other, the magnetic sensing elements being arranged closest to the parallel borders. It is an advantage of embodiments of the present invention that the sensor may comprise parallel pinned sensing elements (e.g. GMR probes) in the same substrate.

The sensor may comprise exactly three concentrator sections.

The sensor may comprise four concentrator sections, the fourth section being separated from the second and third sections by a gap with a minimum width smaller than the minimum width of the gap between the fourth section and the first section. It is an advantage of embodiments of the present invention that the sensors may be deposited easily.

The magnetic sensor may comprise two orthogonal symmetry axes.

The magnetic sensor may have simple axial symmetry or the configuration of the at least three magnetic flux concentrator sections may have simple axial symmetry.

The magnetic sensor may further comprise redundant sensing elements. It is an advantage of embodiments of the present invention that differential sensing can be obtained.

The sensing elements may be configured to act as balanced bridge sensors.

The sensing elements may be sensitive to magnetic fields oriented in the same direction in the plane of the substrate. It is an advantage of embodiments of the present invention that the sensing elements do not need to be oriented with respect to each other, making manufacture easy, for example in case of pinned sensing elements such as GMR probes or ribbons.

The further sensing elements may be positioned in an opening in one of the magnetic flux concentrator sections, the further sensing elements being surrounded by material of said magnetic flux concentrator section.

The further sensing elements may be positioned outside the area defined by the at least three magnetic flux concentrator sections and by the gaps in between these concentrator sections.

The sensing elements may be magnetoresistive sensing elements.

The present invention also relates to an integrated circuit comprising a sensor as described above.

The present invention also relates to the use of a sensor as described above for position determining.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 7 illustrates two embodiments according to the present invention comprising further sensing elements for measuring the field in the Z direction perpendicular to the substrate of the sensor.

FIG. 8 illustrates two embodiments according to the present invention of sensors with shapes other than a circular shape, wherein the sensing elements are included in longitudinal gaps with parallel walls.

FIG. 11 shows two exemplary non-symmetrical embodiments according to embodiments of the present invention.

Figure 1:
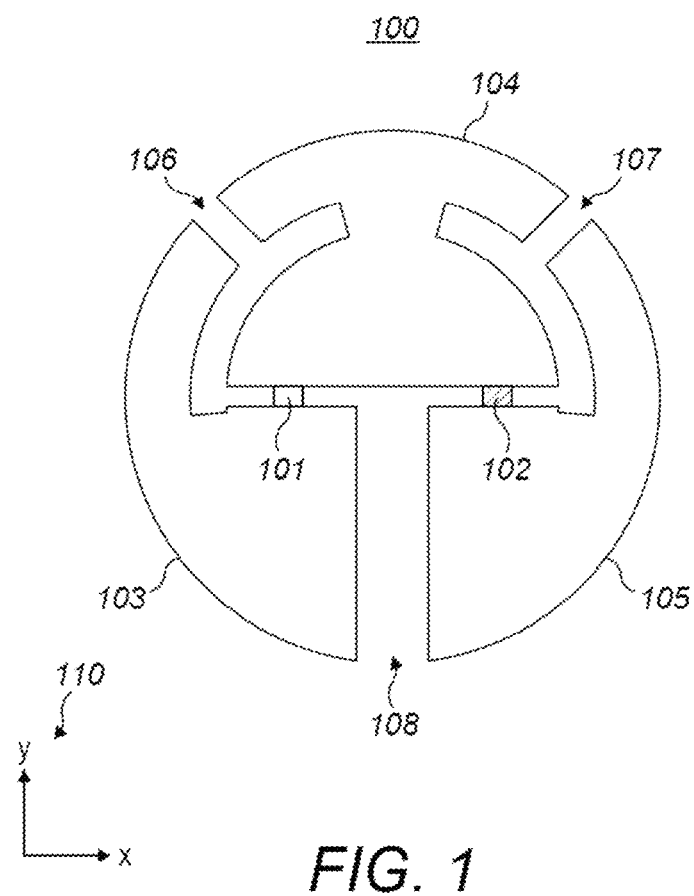
FIG. 1 illustrates an exemplary embodiment according to the present invention comprising three IMC sections with two sensing elements.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "sensing element", reference is made to the part of a sensor which is sensitive to magnetic fields and can provide a measurable response, which gives information of the strength of the sensed magnetic field (e.g. the flux thereof). Sensors of the present invention comprise a plurality of sensing elements distributed in predetermined positions, together with "magnetic flux concentrators", which are devices, usually implemented as surface areas comprising materials adapted to redirect magnetic flux lines. Concentrators are typically integrated in a substrate, forming the "integrated magnetic concentrator" (ICM). The sensor of the present invention comprises several ICMs, or rather ICM sections, separated from each other by gaps. The path between pairs of sections is determined by the shape of the sections and the distances (width of gaps) between them in a predetermined, measurable manner. Where in embodiments of the present invention reference is made to a "pair of sections", reference is made to two sections adjacent to each other, separated by a gap. In the frame of the present invention a pair is considered different from another pair if at least one section is different. This means that for example, with a set of three sections, two pair of sections can be obtained, one of the sections being common to both pairs.

Where in embodiments of the present invention reference is made to a gap, reference is made to an empty space between two sections, but also to a space between two sections filled with some material, e.g. a paramagnetic material (e.g. plastic) or a magnetic material having a magnetic permeability being lower than the permeability of the IMC, e.g. having maximally half the permeability of the IMC.

In a first aspect, the present invention relates to magnetic sensors comprising a plurality of sensing elements and IMCs separated by gaps. The IMCs and gaps are arranged with respect to the sensing elements so as to direct an amount of flux between two ICMs towards at least one sensing element. The IMCs and sensing elements are comprised in a single sensor. The separate output of the sensing elements and the combination of the readings of different sensing elements (e.g. the ratio) gives information of the magnitude and direction of the magnetic field.

In what follows, it will be considered that a sensor comprises one IMC divided in three or more sections separated by gaps, rather than a plurality of IMCs. The sections are completely separated from each other by the gaps. These gaps do not need to be unidirectional and do not need to be longitudinal. For example, the walls of the gaps may have for instance a wedge shape in some parts. Nevertheless, they may also comprise parts with different geometries. The sensor comprises a plurality of sensing elements arranged so as to sense flux densities in or near the gaps between at least some of the sections of the IMC. The sensing elements may be positioned in the gaps, on the surface of the substrate or embedded within the substrate, between pairs of sections. They may be near the gap, for example at a distance of the center of the gap equal to the length of the gap plus the thickness of the concentrator, or less than that distance. The sections and the gaps are arranged with respect to the plurality of sensing elements so as to direct the field lines through the sensing elements. From the magnitude of the responses of the sensing elements, the magnitude can be obtained. The direction of the flux can be obtained from the ratio of the sensed responses. Thus, the sensor according to embodiments of the present invention can measure the magnetic flux through and inside a substrate in multiple (e.g. orthogonal) directions, while at the same time being compact.

The sensing elements may comprise any suitable material or mixture thereof that present sensitivity to magnetic fields and show a measurable reaction thereto. Advantageous elements may present high in-plane sensitivity. For example, vertical Hall plates could be used, but also horizontal Hall plates can be used. The elements may show magneto-resistance effects such as for example giant magneto-resistance (GMR) effects, tunnel magneto-resistance (TMR) effects, etc. In some embodiment the elements may comprise a plurality of multilayered materials which show these properties, such as GMR. Advantages of GMR structures are, for example, that they have a high sensitivity compared to typical Hall sensors, the possibility of introducing these structures in a post process, resulting in a fast and cost efficient way of sensor manufacture, etc. Pinned structures can also be used, for example pinned magnetoresistive structures. It is an advantage of embodiments of the present invention that pinned sensing elements can be provided with no need to optimize the directionality thereof, because the direction in two directions, e.g. two perpendicular directions, in the plane of the substrate can be measured independently in sensors according to the present invention, thanks to the arrangement of the gaps and IMCs, rather than to the direction of the pinned element itself. This reduces the cost of manufacture, because there is no need to provide and align the elements via post processing or transfer printing, which is expensive, time consuming and prone to errors. There is no need either to provide elements or sensors in a different die per direction, which is difficult to align and it is costly.

The sensor of the present invention comprises a plurality of sensing elements distributed in an area of the sensor within the IMC, for example between the sections thereof, optionally including redundant sensing elements, optionally also including additional sensing elements outside the IMC, or in an aperture therein, for example for reading the field in the direction perpendicular to the substrate.

The IMC may be provided in a dedicated chip which can be installed in the device or part thereof where magnetic measurement is needed, such as in throttle position sensors, gear tooth, steering angle sensors, etc. In some embodiments, an IMC may be provided in the substrate of a chip with other integrated elements, such as connection pads, CMOS circuits, reading circuits, etc.

Particular embodiments will further be shown with reference to the drawings.

The sensor according to at least some embodiments of the present invention is provided in a substrate. It provides a measurement in at least each of two directions, e.g. perpendicular directions, in the plane defined by the substrate. FIG. 1 shows an exemplary embodiment of a sensor comprising a substrate 100 and two sensing elements 101, 102 in the gaps between three IMC sections 103, 104, 105. The IMC sections comprise at least a material with higher magnetic permeability than the material of the substrate, so that the magnetic flux has preference to run through the material forming the IMC. In embodiments of the present invention, the IMC typically comprises soft magnetic materials, such as nickel, iron, alloys thereof, or any other suitable material. The IMC may be electroplated. In particular examples it may have a thickness between 10 μm and 30 μm and it may be made for example of NiFe (with a Ni concentration up to 23%).

The sensor according to embodiments of the present invention comprises an IMC divided in three or more sections, in which at least two pairs of sections can be defined. In the example of FIG. 1, where three magnetic concentrator sections are present, these three sections define two predetermined pairs, and a sensing element is placed between each of the two pairs, in the region of each gap. In some embodiments, the distance between the sections forming the two pairs may be small or minimal (e.g. smaller than the distance between the remaining pair). The width may be just wide enough to fit a sensing element. Each of the magnetic concentrator sections may comprise the same material, which allows for a simple manufacturing process. However, the present invention is not limited thereto, and alternatively different materials can be used, even with different magnetic coercivities. The IMC may be at the surface of the IC and the sensors may be either embedded or deposited at the surface.

The sections may be separated by gaps which comprise the same material as the substrate or which comprise a different material complying with the same requirement that it has a higher coercivity than the materials of the IMC. In some embodiments, the gaps may be filled with air or filled with a mold compound (plastic). The distance between the sections does not need to be homogeneous. A gap may comprise wide and thin parts. The specific orientation and width of the gaps advantageously is chosen in order to force the flux lines towards a predetermined area and to force them through a particular part of a gap. Sensing elements 101, 102 (e.g. GMR magnetic probes) are preferably included in or near the thinnest part of the gaps 106, 107 between the first pair of sections 103, 104 and the second pair of sections 104, 105 respectively.

Specifically, the topology of the sections and gaps provides the effect that the easy path of the flux towards one sensing element or another sensing element depends of the direction of the magnetic field to be measured or characterized. The gaps and the distribution around the IMCs can be tailored to ensure different paths of the flux in each IMC for different directions of the magnetic field. The thin parts of the gaps may be directly connected to the external perimeter of the sensor or may not be directly connected to the external perimeter of the sensor (the part of the outer part of the section). In the latter case the thin parts of the gap may be connected to a wider gap, which may be in touch with the external perimeter of the sensor.

The sensing elements may advantageously be present at least in or near the thin parts of the gaps. The field lines will follow the path of least resistance between a particular pair of sections, through the minimum distance between sections (e.g. the thin parts of the gaps), depending on the direction of the magnetic field with respect to the sensor. In advantageous embodiments, the sensing elements are present in gaps at positions with the smallest distance between different pairs of IMC sections, since the field lines will preferably pass these positions as these positions are a path of least resistance. In embodiments of the present invention, a first sensing element may for example be present in the thin part of a gap between a first and second section, and a second sensing element may be present in the thin part of a gap between a first and third section. The ratio between the field lines passing between a first and a second section and the field lines passing between a first and a further section will give information regarding the direction of the field in the X and Y directions, as shown in the graph 110. Moreover, the sensing elements can be sensitive to the orientation of the field through them, so it is possible to distinguish a field flowing from a first to a second section from a field flowing in opposite direction, i.e. from the second to the first section. Information regarding the orientation of the magnetic field thus advantageously can be obtained with a single sensor according to embodiments of the present invention.

In some embodiments, the magnetic concentrator sections are shaped so that a sufficient amount of lines can be concentrated and directed towards the sensing elements in order to obtain a sensor with high sensitivity and high disparity for at least two non-parallel directions of the field. In the particular embodiment shown in FIG. 1, for example, the upper section 101 may comprise an external boundary shaped as a circumference arc covering at least 30°, for example 90° as shown in the particular embodiment of FIG. 1. As described above, the sensing elements are positioned near thin portions of certain gaps. Additionally, gaps are present being wider (e.g. the gap between the second and third sections of the sensor of FIG. 1, being e.g. at least 0.5 times wider, e.g. at least 1.2 times wider, or e.g. 5 time wider than the thin gaps) and these gaps do not comprise sensing elements.

Figure 2:
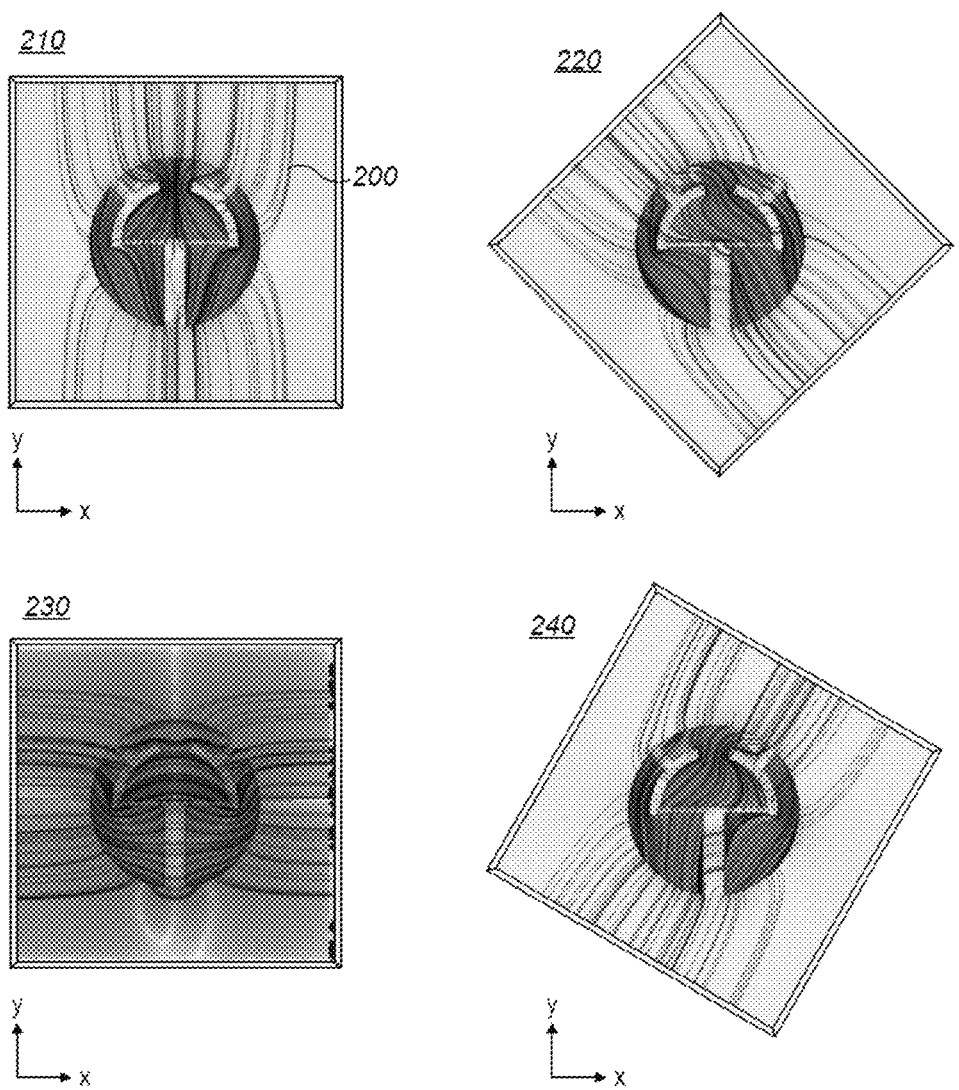
FIG. 2 illustrates the flux lines crossing the surface of the IMC structure at four different angles of the magnetic field with respect to the Y direction for the embodiment shown in FIG. 1.
Figure 3:
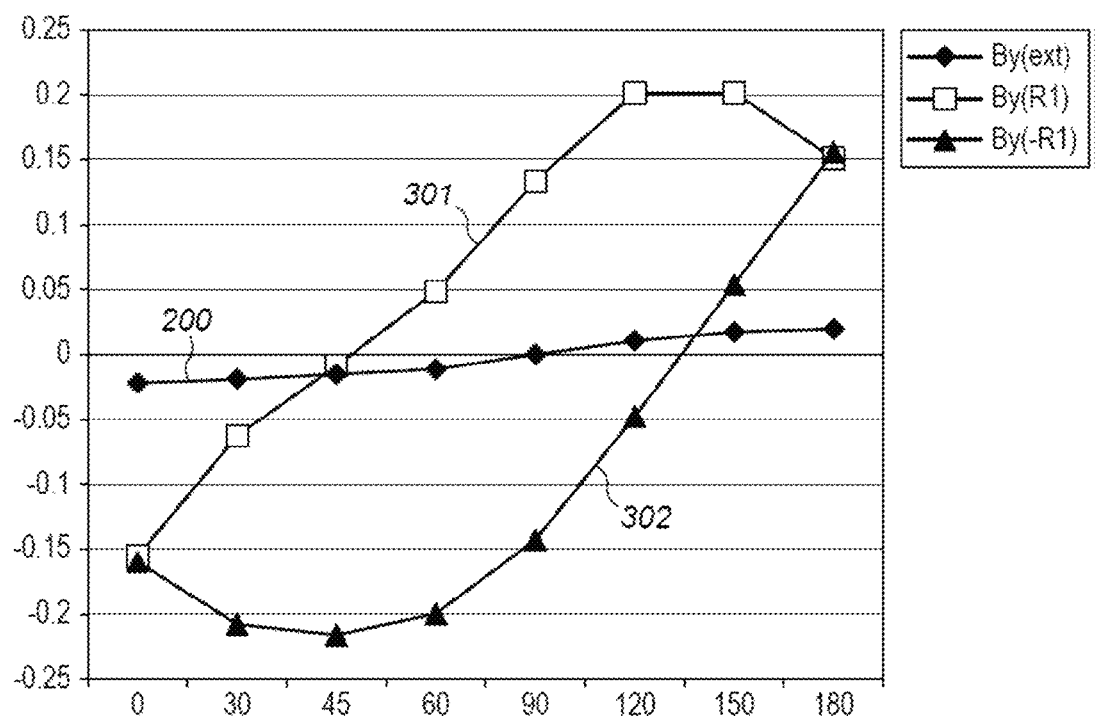
FIG. 3 illustrates a diagram with the magnetic field y-component measured with the sensor of FIG. 1 and the y component of an external field as a function of the IMC angle respect to the external magnetic field.

The flux lines 200 at different angles of the magnetic field with respect to the Y direction of the system 110, arbitrarily selected as the axis of symmetry of the sensor, are shown in FIG. 2 for a device according to FIG. 1. The resulting readings of each sensing element are shown in FIG. 3. In FIG. 2, a darker color indicates a larger field magnitude. The upper left drawing 210 corresponds to a field parallel to the Y direction. In the present example, the amount of lines through each sensitive element and the direction of flux is the same, so the sine and cosine response 301, 302 of the sensing elements 101, 102 have the same value of −0.15 at 0°. The upper right drawing 220 corresponds to a field with a 45° angle with respect to the Y direction. The shape of the wide part of the gaps and sections forces the field lines towards the thin part of the gap 107, so almost no signal crosses the leftmost sensing element 101, which translates into almost no amplitude in its corresponding response 301. A strong signal (with maximum amplitude), on the other hand, crosses the thin part of the gap 107. On the lower left drawing 230, the field is perpendicular to the Y direction in the plane (towards the X direction). The same amount of lines cross through the sensing elements, but in two opposite directions: the field lines cross from the leftmost section 103 to the upper section 104 (positive direction of Y) and from the upper section 104 to the rightmost section 105 (negative direction of Y). Finally, the lower rightmost drawing 240 corresponds to a field with a 150° angle with respect to the Y direction. It is to be noted that through both sensing elements the field lines pass according to the positive direction of Y, but more lines cross through the leftmost sensing element 101 than through the rightmost sensing element 102 as shown in the corresponding lines 301, 302 of the diagram of FIG. 3.

The magnitude can be calculated from the reading too, for example by calibration with a known field, which can be done during manufacture.

Thus, the response to the cosine and sine signals for a first and second sensing elements can be used to directly obtain the X and Y components of the external magnetic field, e.g. by processing the signals using simple mathematical and trigonometrical relations, e.g. in a processing unit, using lookup tables, etc. The device thus can output an angle of the magnetic field or magnetic field components x, y, z. Furthermore absolute values can be provided, if the sensor is calibrated.

Additionally, the sizes and shapes of particular parts of the gaps may be optimized by design in order to obtain a strong sensing signal. In the particular case of FIG. 1, in order to obtain a strong signal, the gap part 108 in the Y direction may be selected to be wider than twice the thin part of the gap 106, 107 in the X direction, and the circular part of the gaps 106, 107 may be selected to be larger than the thin parts of the gaps.

Amplification of the signal or magnetic gain thus is affected by the distance between the sections, the border of the sections (e.g. the radius of the arc of a circular IMC section), and the ratio between the sizes of different parts of the gaps. If too many field lines cross through the wide parts of the gaps, less lines will pass through each sensing element and the sensed signal will be reduced. In advantageous embodiments, the signal read by each sensing element for different directions of the magnetic field is out of phase by 90°.

The distance between the sensing elements and the IMC sections may be the same. The part of the gaps containing the sensing elements (the thin parts) can have a homogeneous width as seen in FIG. 1. This advantageously can help providing a symmetrical reading. For example, in the case that the direction of the field is 0° with respect to the Y direction, the magnitude of flux through both sensing elements would be the same. Nevertheless, the width of the gaps alternatively may not be homogeneous.

Figure 4:
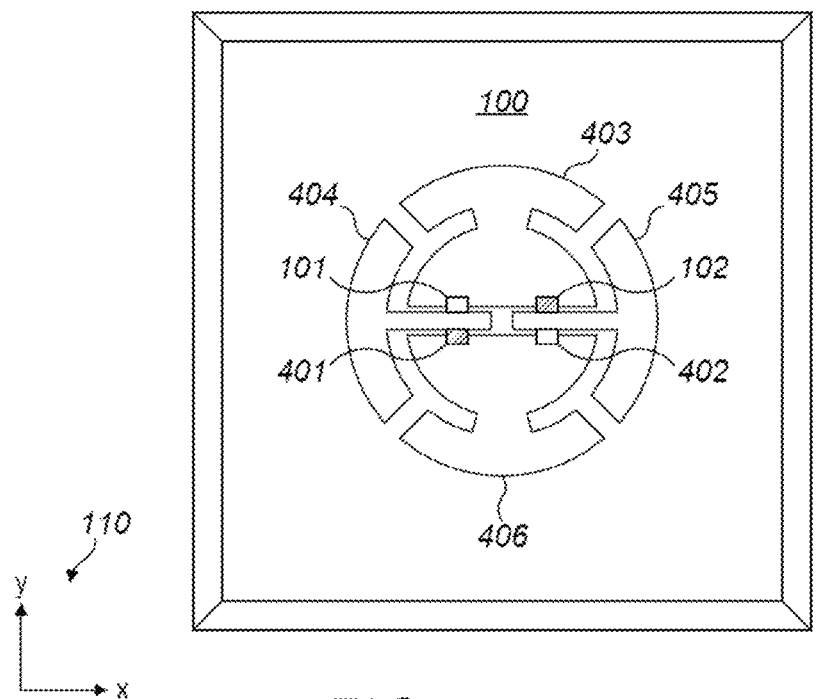
FIG. 4 illustrates an exemplary embodiment according to the present invention comprising four IMC sections, two sensing elements and two redundant sensing elements.

Another embodiment of the present invention is shown in FIG. 4. This particular embodiment comprises four sensing elements 101, 102, 401, 402 and four IMC sections 403, 404, 405, 406. Two of the sensing elements 101, 102 are disposed along thin gaps between a first IMC section 403, and two other IMC sections 404, 405 which can be used for sensing the cosine and sine signals. It is to be noted that although the examples are described with reference to a cosine and sine signal, embodiments of the invention are not limited thereto and more generally reference is made to a first direction and a second direction, which may in preferred embodiments be orthogonal. Furthermore, if the signals are not perfectly orthogonal, calibration can be taken into account to decorrelate the signals. As indicated before for other examples, the particular shape of the IMC sections and the relative sizes of the different parts of the gaps will determine the distribution of the field lines with respect to the different IMC sections, depending of the direction of the external magnetic field. Additionally, in FIG. 4 two other sensing elements are introduced that are two redundant sensing elements 401, 402 in the present example, which are disposed along thin gaps between the fourth IMC section 406 and the previous two other IMC sections 404, 405. For example they may be disposed symmetrically with the rest of the sensing elements. Advantageously robust sensor devices can be obtained, e.g. allowing to detect operational errors via cross-check of the values using the redundant sensing elements.

Figure 5:
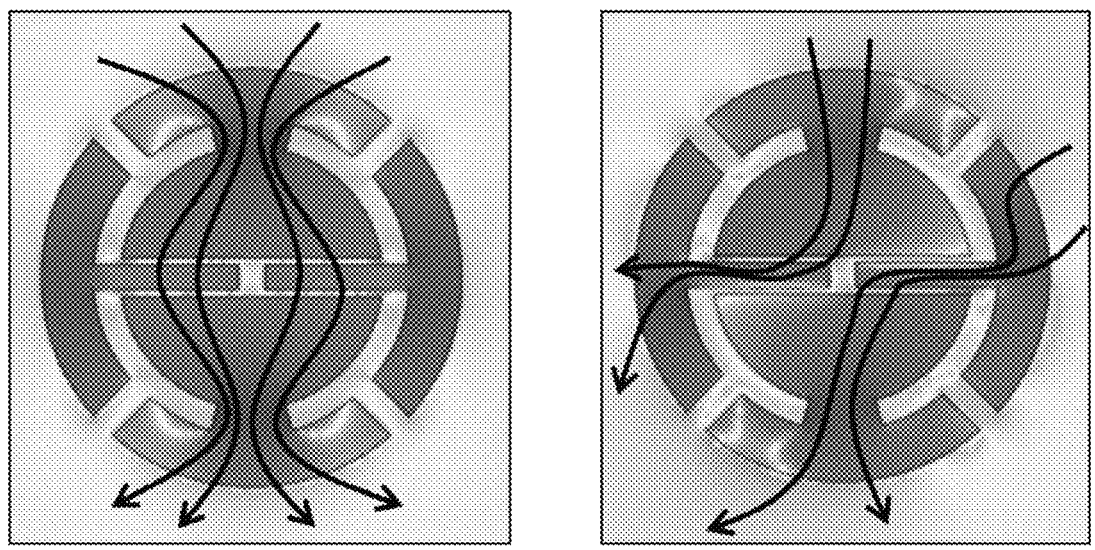
FIG. 5 illustrates the flux lines at two different angles of the magnetic field with respect to the Y direction for the embodiment shown in FIG. 4.
Figure 6:
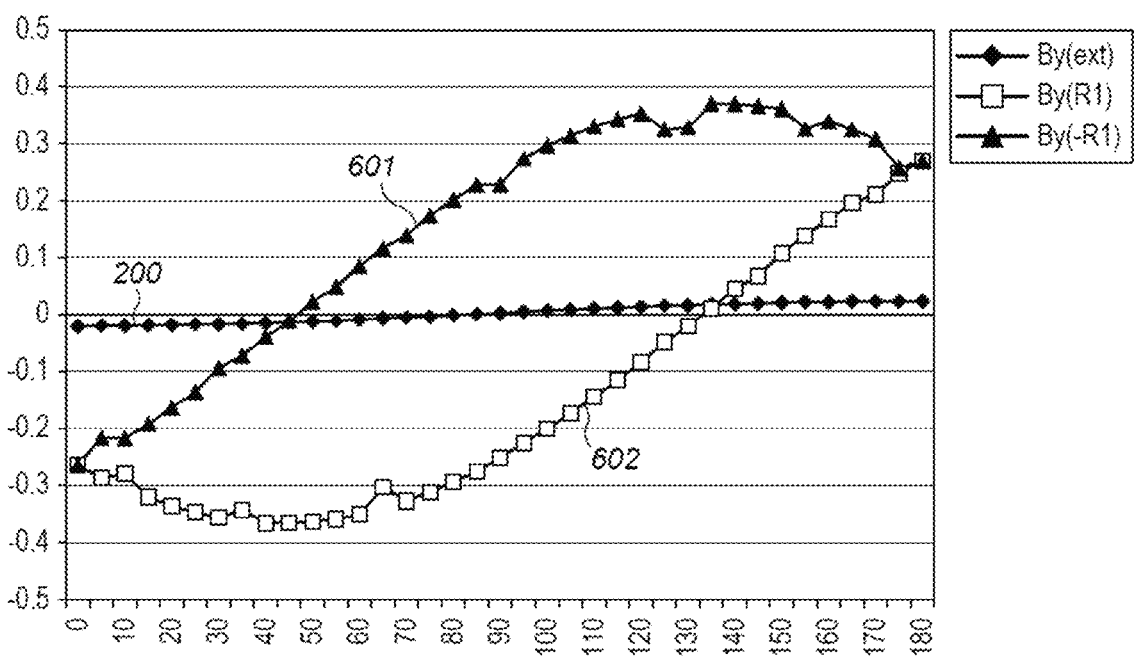
FIG. 6 illustrates a diagram with the sine and cosine components of an external field measured with the embodiment of sensors shown in FIG. 4.

The flux lines 200 at two different angles (0 and 45°) of the magnetic field with respect to the Y direction (arbitrarily selected, according to the coordinate system 110 shown in FIG. 4), are shown in FIG. 5 for the device of FIG. 4. The resulting sine and cosine readings of each sensing element are shown in FIG. 6, from which the field in two orthogonal directions can be directly obtained. As indicated before, the flux within each section is determined by the shape of the section and the different sizes of different parts of the gaps, and the field lines passing through the sensing elements is determined by the flux within each section and the pair of sections between which each sensing element is placed.

In general, there is a good response 301, 302, 601, 602 of the sensing elements 101, 102, 401, 402, which provide high signals with respect to a relatively weak external field 200.

Again, the above example illustrates that a single sensor is sufficient for determining magnetic field components of a magnetic field in different directions, e.g. opposite directions in a plane. Embodiments of the present invention obtain this by using a plurality of sensing elements (even collinear or parallel sensing elements, e.g. pinned elements) between pairs of magnetic concentrator sections of a single sensor.

In embodiments of the present invention, the sensor may also comprise sensing elements arranged to measure changes of the magnetic field in a direction perpendicular to a plane (e.g. the plane of a substrate), also referred to as the Z direction. For example, sensing in the Z direction can be done by sensing the deviation of the magnetic field component that is perpendicular to the substrate, the deviation being due to the presence of the integrated magnetic flux concentrator. These sensing elements may be disposed at the external borders of the IMC sections. The leftmost drawing 700 of FIG. 7 shows sensing elements 701, 702 disposed at different sides of a sensor (e.g. diametrically opposite, as shown in the figure, although other arrangements are possible). However, they may be also present within predetermined gaps between IMC sections, for example in wide gaps. The asymmetry of magnetic lines between entering/exiting the concentrators through the sensing elements 701, 702 makes the inplane sensor sensitive to the z field.

The sensing elements may be disposed on areas within an IMC section, as shown in the right drawing 710 of FIG. 7, which makes the sensor even more compact. In this case, the elements 711, 712 may be disposed for example inside an opening 713 within the section, thus in contact with the substrate but completely surrounded by IMC material. The opening 713 may be adapted to disturb minimally the path of field lines within the sections; for example it may be circular, which does not break the symmetry.

Some embodiments of the present sensor may present $2^{nd}$ order rotational symmetry with respect of the center of the sensor (symmetry with respect to two axis) as shown in the exemplary sensor of FIG. 3, or only axial symmetry as shown in FIG. 1. Other shapes, dispositions and arrangements of the IMC sections, gaps and sensing elements can be used, as long as the amount of field lines through each sensor element depends on the direction of the external magnetic field. Shapes other than circular shapes can be used for the sensor, possibly increasing the flexibility of design thus allowing to make the sensor more compact utilizing optimally the area of the substrate.

For example, in FIG. 8, two possible examples of non-circular sensors are shown. In both these examples, the sensor has a triangular shape and three sections. Only the upper drawing 800 shows a sensor with symmetrical sections. The lowest drawing 810 comprises asymmetrical sections. In both cases, the sensing elements are placed in the thin parts of the gaps between a first upper section 801, 811 and the two other sections 802, 812, 803, 813. The gap between the two other sections 802, 812, 803, 813 themselves is wider. In some embodiments, the gain of the IMC can be minimized, for example in sensors with a low saturation point.

Where wide gaps are present between the sections, no sensing element needs to be present, since the design intends to minimize the amount of lines expected to cross between these sections anyway. This forces most of the lines to cross through the sections with a thinner gap comprising the sensing elements for the detection of field in orthogonal (e.g. X and Y) directions. However, although no sensing element needs to be present in said wide gap, a further sensing element may be positioned there close to the edges, e.g. as part of a system for detecting the field in a Z direction. The gaps do not need to be homogeneous, they may comprise curved parts and thin and wide parts, as already described above for other examples. Thin gaps 814, 815 between different IMC sections, and the sensing elements therein, do not need to be collinear, as shown in the lowest drawing 810 of the FIG. 8.

Figure 9:
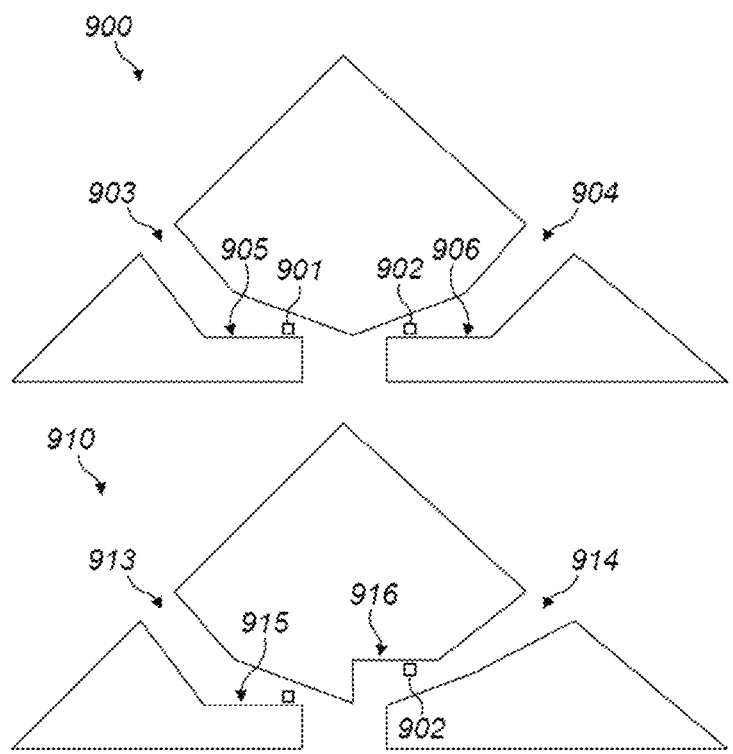
FIG. 9 illustrates two embodiments according to the present invention of sensors with shapes other than a circular shape, wherein the sensing elements are included next to the walls of different gaps that are parallel to each other, the gaps themselves having wedge shape.

FIG. 9 shows two exemplary embodiments 900, 910 with irregular, non-linear gaps. In the upper drawing 900, the gaps 903, 904, comprising sensing elements 901, 902 may comprise two parallel and collinear walls 905, 906. However, alternatively the walls can also be non-collinear. An example of non-collinear parallel walls is shown in the lowest drawing 910 of FIG. 9, wherein the gaps 913, 914 comprising sensing elements comprise two, non-collinear, walls 915, 916. The walls may be parallel, although this is not required. The magnetic sensor only must be sensing the Y field, no matter of the edge orientation. In any case, in the present example, the sensing elements are placed next to these parallel walls, so there is no need to orient each of the sensing elements in a specific direction with respect to the others. It is an advantage of some embodiments to position the sensing elements close to the parallel planes since close to them, the field is always along the Y axis, i.e. at boundary conditions.

According to some embodiments, the gaps can be collinear by pairs. The sensing elements in the gaps may be positioned such that sine and cosine signals measured are well or even optimally separated from each other.

Figure 10:
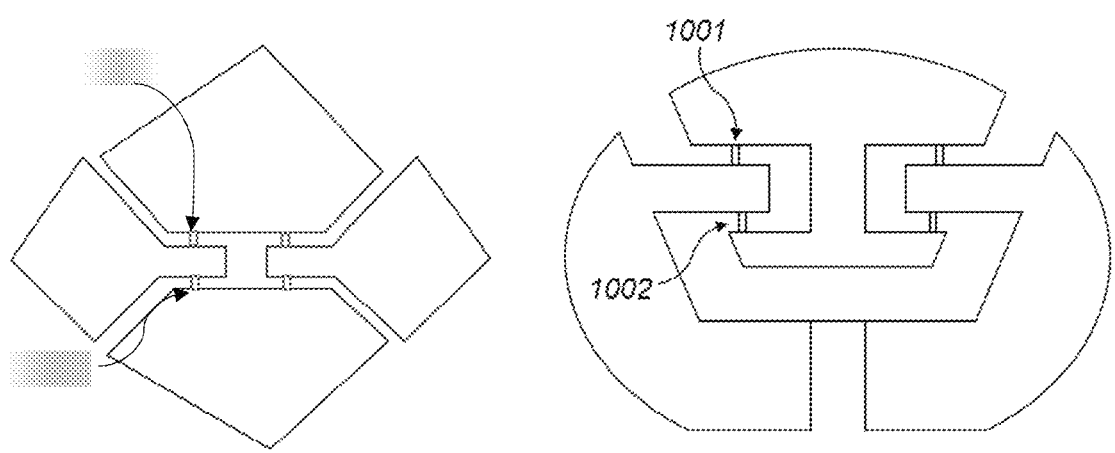
FIG. 10 illustrates two embodiments according to the present invention of sensors with four and three sections, and each having two pairs of sensing elements.

FIG. 10 shows two further embodiments. The leftmost figure in FIG. 10 shows a sensor with four IMC sections and non-circular shape. The rightmost figure in FIG. 10 shows a sensor with three IMC sections and including redundant sensing elements. In both embodiments, the design of the IMC sections and the gaps is such that the highest number of field lines pass through the thin parts of the gaps where sensing elements are placed. The magnitude and orientation of the field is again determined by analyzing the signals provided by both sensing elements, and the ratio thereof. It is to be mentioned that in the rightmost figure of FIG. 10 there is an inversion of the magnetic field direction between the two sensing elements (1001, 1002). This results in two opposite responses to the magnetic field cosine component, allowing the construction of a balanced differential bridge to sense the cosine component of the field.

FIG. 11 shows two embodiments of the present invention, following the same principle as sensors according to embodiments described above but with an irregular, non-symmetrical shape, for example comprising irregularly shaped IMCs 1100, 1110. The sensing elements 1101, 1102 can still be pinned and have the same orientation. Both can be provided next to parallel walls between different gaps 1103, 1104, 1113, 1114. Further sensing elements 1105, 1106 for sensing in the Z direction can be included. None of the sensing elements need to be oriented with respect to the other while they still provide information of the direction of the field.

The sensor may occupy an area of at most 2 $mm^2$, for example 1 $mm^2$ or less, for example between 0.1 $mm^2$ and 1 $mm^2$. Thus, a compact device can be obtained which can be easily integrated in other circuits.

The sensor may be introduced at positions in systems where sensing is required. It may be a provided as an integrated component as such or alternatively, the sensor substrate may be shared with other circuits, resulting in a further or fully integrated device.

In summary, the sensor according to embodiments of the present invention comprises magnetic concentrator sections and gaps that can be arranged so that the density of field lines in each MC section is representative of the angle of the external field with respect to the device. The device may be used in position sensors, linear or rotary but also in, for example, current sensors. The magnetic field passing from an IMC section to another can be detected by the sensing elements in or near the gaps, thus obtaining a reading representative of the amount of magnetic field lines (flux) crossing between pairs of IMC sections. The sensing elements may have a single orientation in the substrate. Because the magnetic field lines are, in turn, representative of the direction of the external field, by reading the magnetic field passing between a first IMC section and at least a second section and a first section and at least a third section, the direction and magnitude of the incident magnetic field can be obtained using a single sensor. It is an advantage of embodiments of the present invention that these allow an increased tolerance to misalignment of the magnet and of the IC, as well as in that the complexity of the system can be decreased. Because the high freedom of the IMC design, high amplification of the signals can be obtained, as can be seen when comparing the measured components with the external field 200 illustrated in for example the diagrams of FIG. 3 and FIG. 6. It is an advantage of embodiments of the present invention that, since field components in different directions can be measured using a single sensor, it is possible to obtain the magnetic field magnitude and direction in a single spot. When two different sensors are required, this typically results in disturbances caused by the physical separation of the different sensors required to avoid disturbance of the lines in the different sensors e.g. by their IMC. Since in embodiments of the present invention a single sensor can be used, there is no crosstalk between sensors and the IMC footprint is reduced.

According to embodiments of the present invention, the measurement of a magnetic field angle can also be used to detect a position of a magnet, such as for example to detect an angular or linear displacement of a magnet.

The invention claimed is:
1. A magnetic field sensor comprising:
   at least three magnetic flux concentrator sections integrated on a substrate defining a plane, each of the at least three sections being adjacent to at least one of the other sections, and each of the at least three sections being separated from each of the other sections by one or more first gaps,
   the magnetic field sensor comprising at least
      a first magnetic sensing element positioned for measuring flux density in or near the first gap between a first section and a second section, and
      at least a second magnetic sensing element positioned for measuring flux density in or near the first gap between the first section and a third section,
   wherein the magnetic field sensor further comprises one or more further sensing elements arranged to measure changes of the magnetic field in the direction perpendicular to the substrate,
   wherein
      the one or more further sensing elements are arranged at or outside external borders of the magnetic flux concentrator sections, or
      the one or more further sensing elements are arranged within one or more further gaps, the one or more further gaps being wider than the first gaps, or
      the one or more further sensing elements are positioned in an opening in one of the magnetic flux concentrator sections with the one or more further sensing elements being surrounded by material of said magnetic flux concentrator.

2. The magnetic field sensor of claim 1, wherein the shape of the sections and the shape and width of gaps there between being adapted for directing the magnetic field lines of an external magnetic field inside the concentrator sections such that the magnetic field at the sensing elements is representative of the orientation and magnitude of the external magnetic field.

3. The magnetic field sensor of claim 1 wherein the sensing elements are sensitive to magnetic fields in a same direction in the plane.

4. The magnetic field sensor of claim 1, wherein the first section, the second section, and the third section are in a triangular arrangement.

5. The magnetic field sensor of claim 1, wherein a first of the first gaps comprises at least one border with a section and a second of the first gaps comprises at least one border with a different section,
   wherein the at least two borders are parallel with each other and wherein the magnetic sensing elements are arranged closest to the parallel borders.

6. The magnetic field sensor of claim 1, wherein the sensor comprises exactly three concentrator sections.

7. The magnetic field sensor of claim 1, wherein the sensor comprises four concentrator sections, the fourth concentrator section being separated from the second and third sections by a gap with a minimum width smaller than the minimum width of the gap between the fourth section and the first section.

8. The magnetic field sensor of claim 1, comprising two orthogonal symmetry axes.

9. The magnetic field sensor of claim 1, wherein the magnetic sensor has simple axial symmetry or wherein the configuration of the at least three magnetic flux concentrator sections has simple axial symmetry.

10. The magnetic field sensor of claim 1, further comprising redundant sensing elements.

11. The magnetic field sensor of claim 1, wherein the sensing elements are configured as balanced bridge sensors.

12. The magnetic field sensor of claim 1, wherein the sensing elements are sensitive to magnetic fields oriented in the same direction in the plane of the substrate.

13. The magnetic field sensor of claim 1, wherein the sensing elements are magnetoresistive sensing elements.

14. The magnetic field sensor of claim 1, wherein the one or more further sensing elements are positioned in an opening in one of the magnetic flux concentrator sections with the one or more further sensing elements being surrounded by material of said magnetic flux concentrator section.

15. The magnetic field sensor of claim 1, wherein the one or more further sensing elements are arranged at or outside external borders of the magnetic flux concentrator sections.

16. An integrated circuit comprising the magnetic field sensor according to claim 1.

17. A method of determining a position, the method comprising:
   providing a magnetic field sensor; and
   using the magnetic field sensor to determine a position;
   wherein the magnetic field sensor includes at least three magnetic flux concentrator sections integrated on a substrate defining a plane, each of the at least three sections being adjacent to at least one of the other sections, and each of the at least three sections being separated from each of the other sections by one or more first gaps, the magnetic field sensor further including at least
- a first magnetic sensing element positioned for measuring flux density in or near the first gap between a first section and a second section, and
- at least a second magnetic sensing element positioned for measuring flux density in or near the first gap between the first section and a third section, wherein the magnetic field sensor further includes one or more further sensing elements arranged to measure changes of the magnetic field in the direction perpendicular to the substrate, wherein
- the one or more further sensing elements are arranged at or outside external borders of the magnetic flux concentrator sections, or
- the one or more further sensing elements are arranged within one or more further gaps, the one or more further gaps being wider than the first gaps, or
- the one or more further sensing elements are positioned in an opening in one of the magnetic flux concentrator sections with the one or more further sensing elements being surrounded by material of said magnetic flux concentrator.

18. A magnetic field sensor comprising:

magnetic flux concentrator sections including at least a first section, a second section, and a third section, each of the magnetic flux concentrator sections being integrated on a substrate that defines a plane, adjacent to at least one of the other sections, and separated by a gap such that
- the first section and the second section are separate by a first gap,
- the first section and the third section are separated by a second gap, and
- the second section and the third section are separated by a third gap;

a first magnetic sensing element positioned for measuring flux density in or near the first gap; and a second magnetic sensing element positioned for measuring flux density in or near the second gap; and a third sensing element arranged to a measure change of the magnetic field in a direction perpendicular to the substrate.

19. The magnetic field sensor according to claim 18, further comprising one or more further sensing elements arranged to measure changes of the magnetic field in a direction perpendicular to the substrate, wherein
- the one or more further sensing elements are arranged at or outside external borders of the magnetic flux concentrator sections, or
- the one or more further sensing elements are arranged within one or more further gaps, the one or more further gaps being wider than the first gaps, or
- the one or more further sensing elements are positioned in an opening in one of the magnetic flux concentrator sections with the one or more further sensing elements being surrounded by material of said magnetic flux concentrator.

20. The magnetic field sensor of claim 1, wherein the one or more further sensing elements are arranged at or outside external borders of the magnetic flux concentrator sections.

* * * * *